(12) United States Patent
Liu

(10) Patent No.: US 8,446,225 B2
(45) Date of Patent: May 21, 2013

(54) SURFACE MOUNTED OVEN CONTROLLED CRYSTAL OSCILLATOR

(75) Inventor: Chaosheng Liu, Guangdong (CN)

(73) Assignee: Guangdong Dapu Telecom Technology Co., Ltd., Dongguan, Guangdong (CN)

( * ) Notice: Subject to any disclaimer, the term of this patent is extended or adjusted under 35 U.S.C. 154(b) by 0 days.

(21) Appl. No.: 13/144,441

(22) PCT Filed: Oct. 26, 2009

(86) PCT No.: PCT/CN2009/074615
§ 371 (c)(1),
(2), (4) Date: Jul. 13, 2011

(87) PCT Pub. No.: WO2011/026277
PCT Pub. Date: Mar. 10, 2011

(65) Prior Publication Data
US 2012/0146735 A1    Jun. 14, 2012

(30) Foreign Application Priority Data
Sep. 2, 2009 (CN) .......................... 2009 1 0042381

(51) Int. Cl.
*H03B 1/00* (2006.01)
*H03B 5/32* (2006.01)
*H01L 41/053* (2006.01)

(52) U.S. Cl.
USPC .............................. 331/68; 331/158; 310/348

(58) Field of Classification Search
USPC ................. 29/25.35; 310/311, 344, 346–348, 310/361, 363–366; 331/68–70, 108 C, 108 D, 331/116 FE, 116 M, 116 R, 154, 158
See application file for complete search history.

(56) References Cited

U.S. PATENT DOCUMENTS

| | | | | |
|---|---|---|---|---|
| 6,229,249 B1 * | 5/2001 | Hatanaka et al. | ............. | 310/348 |
| 7,023,291 B2 * | 4/2006 | Kato et al. | ..................... | 331/158 |
| 7,076,870 B2 * | 7/2006 | Hsieh | ............................. | 29/852 |
| 7,242,258 B2 * | 7/2007 | Hatanaka et al. | ............... | 331/68 |
| 7,936,114 B2 * | 5/2011 | Numata et al. | ................ | 310/348 |
| 8,020,265 B2 * | 9/2011 | Onitsuka et al. | ............. | 29/25.35 |
| 8,032,997 B2 * | 10/2011 | Numata et al. | ............... | 29/25.35 |
| 8,179,022 B2 * | 5/2012 | Murata | ........................ | 310/348 |
| 8,278,567 B2 * | 10/2012 | Nakamura et al. | ............ | 174/541 |
| 8,278,801 B2 * | 10/2012 | Matsumoto | ................... | 310/344 |
| 2009/0205183 A1 * | 8/2009 | Tomiyama et al. | .......... | 29/25.35 |

\* cited by examiner

*Primary Examiner* — Levi Gannon
(74) *Attorney, Agent, or Firm* — Shimokaji & Associates P.C.

(57) ABSTRACT

A surface mounted oven controlled crystal oscillator includes a crystal oscillator shell, a crystal oscillation circuit, several functional pins and a base plate. The crystal oscillation circuit is accommodated in a cavity that is formed by the crystal oscillator shell and the base plated and electrically connects with the functional pins. The functional pins drill through the base plate from the cavity. An insulating layer is formed between each functional pin and the base plate. The surface mounted oven controlled crystal oscillator further includes several pads formed at an outer surface of the base plate. The insulating layer is also formed between each pad and the base plate, and the functional pins are electrically connected with the corresponding pads respectively. Added pads, the oven controlled crystal oscillator has high stability, simple manufacturing process, and low manufacturing cost. Moreover, the oven controlled crystal oscillator is mounted on the product by using surface mounted technology, thereby achieving mechanized batch production with high efficiency.

6 Claims, 5 Drawing Sheets

SURFACE MOUNTED OVEN CONTROLLED CRYSTAL OSCILLATOR

FIELD OF THE INVENTION

The present invention relates to a field of crystal oscillators and, more particularly, to a surfaced mounted oven controlled crystal oscillator.

BACKGROUND OF THE INVENTION

Quartz crystal oscillator has been used for several decades and played an important role in the electronics industry for its high frequency stability. Especially under a high development of the information technology industry, this quartz crystal oscillator is full of vitality much more. The quartz crystal oscillators served as a standard frequency source or a pulse signal source provide a frequency reference in telecommunications, satellite communications, Mobile Phone System, Global Positioning System, navigation, remote control, aerospace, high-speed computer, precise measuring instrument and consumable electronic products, which can not be replaced by other oscillators. The quartz crystal oscillators generally include non-temperature compensated crystal oscillator, temperature compensated crystal oscillator, voltage-controlled crystal oscillator, oven controlled crystal oscillator, and digital/μp compensated crystal oscillator. Therein the oven controlled crystal oscillator has the highest frequency stability and the highest precision, and the performances of aging rate, temperature stability, long-term stability, and short-term stability are excellent, therefore the oven controlled crystal oscillator is widely used in electronic equipments such as Global Positioning System, communications, measurement, telemetry and remote, spectrum and network analyzer.

A conventional oven controlled crystal oscillator commonly uses a double in-line package, and FIGS. 1a-1b show a common oven controlled crystal oscillator. The oven controlled crystal oscillator 1 includes a crystal oscillator body 11 and a base 12, and the crystal oscillator body 11 is fixed on the base 12. The base 12 includes a base plate 121, functional pins 122 and base protrusions 123. Concretely, the functional pins 122 are electrically connected with a crystal oscillation circuit (not shown), and a circular insulating layer 124 is formed around the functional pin 122 so as to insulate against the metal base plate 121. When the functional pins 122 of the oven controlled crystal oscillator 1 are directly soldered to the client products by an inserting way, the base protrusions 123 can prevent the oven controlled crystal oscillator 1 from directly contacting the products. With the oven controlled crystal oscillator soldered to the product, on one hand, the height thereof is bigger which goes against the compact manufacturing of the electronic product; on the other hand, faulty soldering may appear on the functional pins 122 which causes a bad contact on the oven controlled crystal oscillator, and decreases the working stability. In addition, the assembly using in-line package of the oven controlled crystal oscillator needs manual operation, thus the cost is high and the production efficiency is quite low.

For improving the production efficiency and decreasing the cost, the manufacturer of the oven controlled crystal oscillator improved the current oven controlled crystal oscillator with the in-line package. Referring to FIGS. 2a-2b, the oven controlled crystal oscillator 2 also includes a crystal oscillator body 21 and a base 22. But the difference compared to the oven controlled crystal oscillator 1 is that, the functional pins 222 of the oven controlled crystal oscillator 2 are firstly soldered to a conversion printed circuit board 225, and then the oven controlled crystal oscillator 2 is soldered to the client product via pads 226 on the conversion printed circuit board 225, so as to obtain a surface mounted oven controlled crystal oscillator. However, with the above-mentioned surface mounted way, since the weight of the oven controlled crystal oscillator is heavy, thus the oscillation thereof may invalidate the electric connection at the pins when on operation. Thus, the oven controlled crystal oscillator using the surface mounted way ordinarily has a small cubage. At the same time, as shown in FIG. 2a, the height of the oven controlled crystal oscillator 2 is still big as a portion of the functional pins is exposed outside. Moreover, when the client products undergo a reflow oven, the pins on the conversion printed circuit board 225 may cause faulty soldering as the solder melts under a high temperature. Or a problem that the oven controlled crystal oscillator 2 may be deflective due to the weight itself will happen. Furthermore, the manufacturing process of this oven controlled crystal oscillator 2 is complicated, which goes against the mechanization batch production with a high efficiency, and the manufacturing cost is high.

Thus, there is a need for an improved surface mounted oven control crystal oscillator with high stability, simple manufacturing process and high-efficiency assembly to overcome the above drawbacks.

SUMMARY OF THE INVENTION

One aspect of the present invention is to provide a surface mounted oven controlled crystal oscillator with high stability, simple manufacturing process and high-efficiency assembly.

To achieve above objective, the present invention provides a surface mounted oven controlled crystal oscillator comprising a crystal oscillator shell, a crystal oscillation circuit, several functional pins, and a base plate, the crystal oscillation circuit being accommodated a cavity that is formed by the crystal oscillator shell and the base plated and electrically connecting with the functional pins, the functional pins drilling through the base plate from the cavity, and an insulating layer being formed between each functional pin and the base plate, and the surface mounted oven controlled crystal oscillator further comprises several pads formed at an outer surface of the base plate, the insulating layer is also formed between each pad and the base plate, and the functional pins are electrically connected with the corresponding pads respectively.

In comparison with the prior art, the functional pins of the surface mounted oven controlled crystal oscillator of the present invention drill through the base plate from the cavity to electrically connect with the pads. This oven controlled crystal oscillator is welded to the corresponding client product via the pads by using surface mounted technology. On one hand, a conversion printed circuit board is omitted, thereby increasing the stability of the oven controlled crystal oscillator, simplifying the manufacturing process and decreasing the manufacturing cost thereof; on the other hand, since the pads are connected with the functional pins directly, and then the oven controlled crystal oscillator is connected with the product via the pads, thereby avoiding faulty soldering on the functional pins or deflection on the oven controlled crystal oscillator during the wave soldering process of the client product and, in turn, improving the electric connection performance and the stability of the oven controlled crystal oscillator. Furthermore, the oven controlled crystal oscillator can use the surface mounted technology, which achieves mechanized batch production with high efficiency.

Preferably, the pad is formed by a portion of the functional pin that drills through the base plate. The pad and the functional pin is molded in one piece, thereby ensuring a good performance of electric connection of the oven controlled crystal oscillator, and improving the stability of the oven controlled crystal oscillator.

Preferably, the pad is formed by molding or punching the portion of the functional pin that drills through the base plate, thereby simplifying the manufacturing process and increasing the electric connection performance of the oven controlled crystal oscillator.

Preferably, the area of the pad is larger than the cross section area of the functional pin, thus the pad is hard to disengage.

Preferably, the functional pin has a protrusion portion formed at an inner surface of the base plate corresponding to the pad. With the design of the protrusion portion, the connection between the functional pin and the pad is much firm, thereby increasing the electric connection performance.

Preferably, the pad is circular, oval or polygonal.

Preferably, a height difference between the pad and the outer surface of the base plate is less than 2 mm.

This invention will become much clearer according to the following detailed description in conjunction with the accompanying drawings. These accompanying drawings are used for explaining the embodiments of the present invention.

BRIEF DESCRIPTION OF THE DRAWINGS

The accompanying drawings facilitate an understanding of the various embodiments of this invention. In such drawings:

FIG. 1b is a bottom view of the oven controlled crystal oscillator shown in FIG. 1a;

FIG. 2b is a bottom view of the oven controlled crystal oscillator shown in FIG. 2a;

FIG. 3b is a bottom view of the surface mounted oven controlled crystal oscillator shown in FIG. 3a;

FIG. 3c is an enlarged view of the functional pin and pad of the surface mounted oven controlled crystal oscillator shown in FIG. 3a;

FIG. 4b is a bottom view of the surface mounted oven controlled crystal oscillator shown in FIG. 4a; and FIG. 4c is an enlarged view of the functional pin and pad of the surface mounted oven controlled crystal oscillator shown in FIG. 4a.

DETAILED DESCRIPTION OF ILLUSTRATED EMBODIMENTS

Figure 1A:
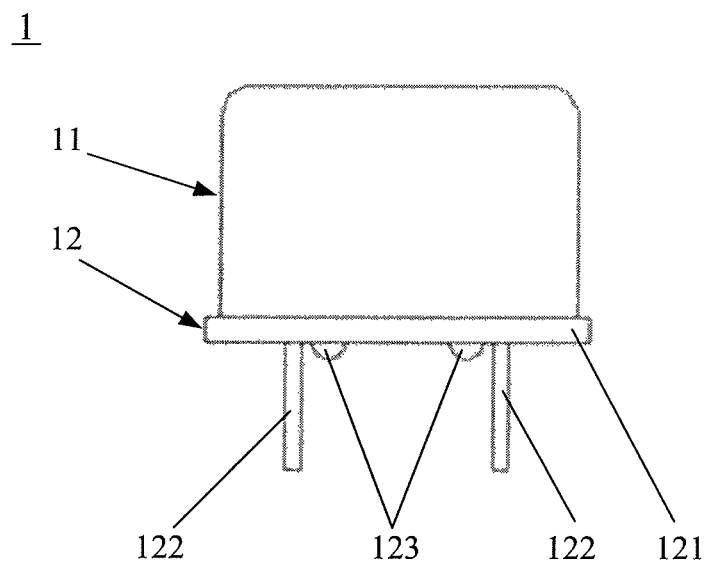
FIG. 1a is a front view of a conventional oven controlled crystal oscillator.
Figure 1B:
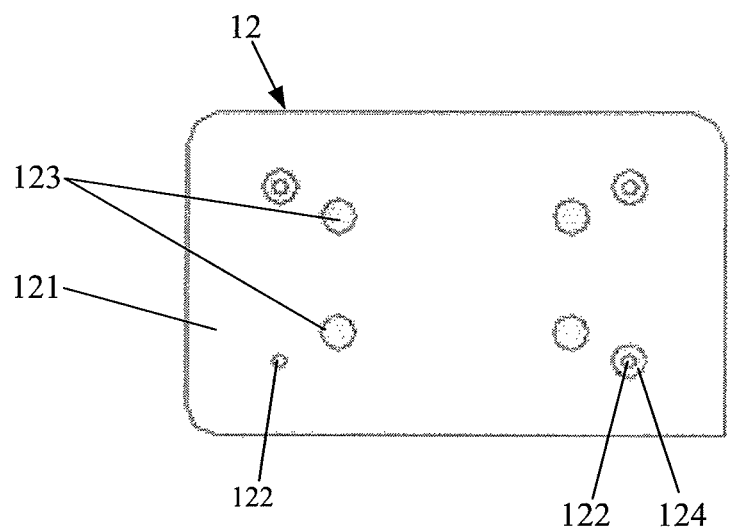
Figure 2A:
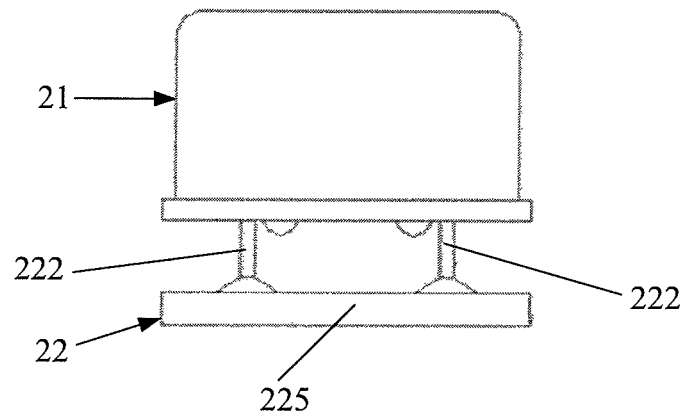
FIG. 2a is a front view of another conventional oven controlled crystal oscillator.
Figure 2B:
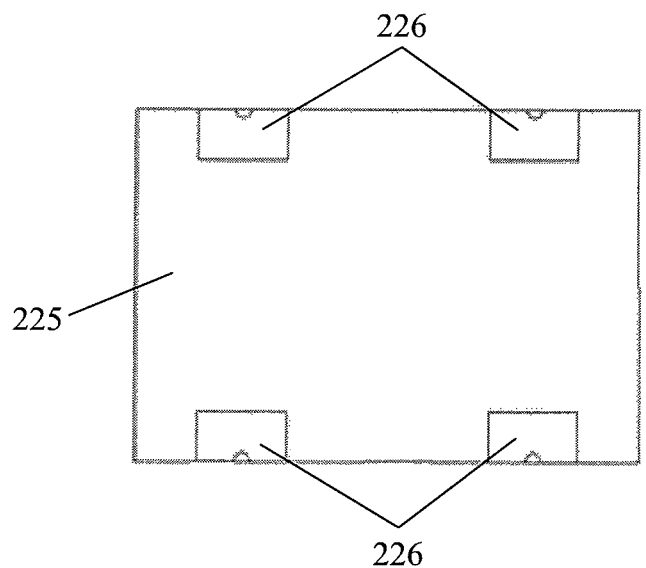

Various preferred embodiments of the invention will now be described with reference to the figures, wherein like reference numerals designate similar parts throughout the various views. As indicated above, the invention is directed to a surface mounted oven controlled crystal oscillator having pads, which has high stability, simple manufacturing process and achieves high-efficiency assembly.

Figure 3A:
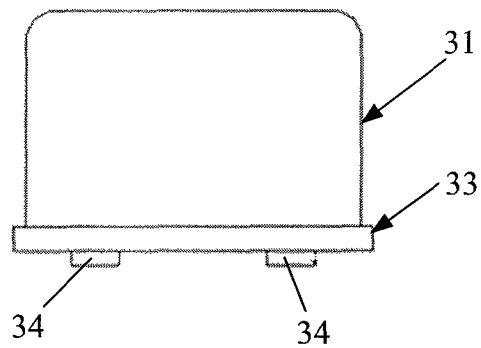
FIG. 3a is a front view of the surface mounted oven controlled crystal oscillator according to a first embodiment of the present invention.
Figure 3B:
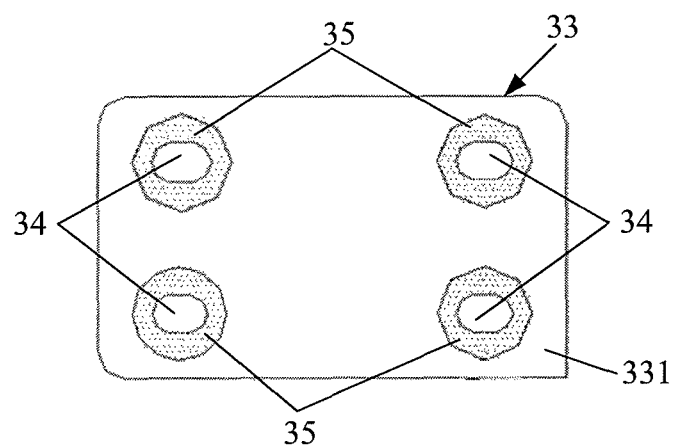
Figure 3C:
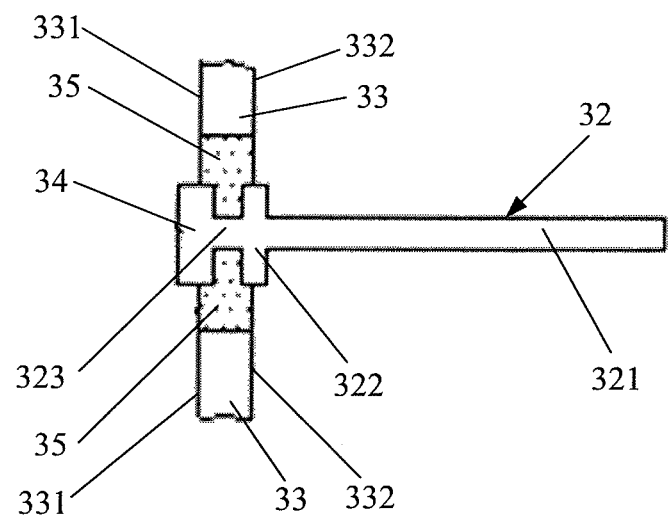

FIGS. 3a-3c show a surface mounted oven controlled crystal oscillator according to a first embodiment of the present invention. Referring to FIGS. 3a-3c, the surface mounted oven controlled crystal oscillator 3 includes a crystal oscillator shell 31, a crystal oscillation circuit (not shown), functional pins 32, and a base plate 33. Concretely, the crystal oscillation circuit is accommodated in a cavity (not shown) that is formed by the crystal oscillator shell 31 and the base plate 33 and electrically connects with the functional pins 32. The crystal oscillation circuit and a portion of the functional pin 32 are formed within the cavity. The inner surface 332 of the base plate 33 is fixedly connected with the crystal oscillator shell 31. Concretely, the crystal oscillator shell 31 can be fixed on the base plate 33 by a welding way of buckling way. The functional pin 32 drills through the base plate 33 from the cavity, and an insulating layer 35 is formed between each functional pin 32 and the base plate 33. Several pads 34 are formed on the outer surface 331 of the base plate 33, the insulating layer 35 is also formed between each pad 34 and the base plate 33, and the functional pins 32 are electrically connected with the corresponding pads 34 respectively.

Referring to FIGS. 3a-3c, concretely, the base plate 33 is embedded with the insulating layer 35, whose shape is according with the circular pads 34. Namely, the insulating layer 35 is a hollow column, whose height is the same with the thickness of the base plate 33. The amount of the insulating layer 35 is four; they encircle around and fixedly connect with the four pads accordingly. In the present embodiment, the amount of the functional pin 32 is four; and one end of the four functional pins 32 drills through the four insulating layers 35 and electrically connects with the corresponding pad 34, and the other end of the four functional pins 32 is electrically connected with the crystal oscillation circuit. With the design of the insulating layer 35, not only the pads 34 are not easy to disengage from the base plate 33, but also the pads 34 are insulated therefore.

Concretely, referring to FIGS. 3b-3c, the functional pin 32 includes a first pin 321, a protrusion portion 322 and a second pin 323. One end of the first pin 321 is electrically connected with the crystal oscillation circuit, and the other end is electrically connected with the protrusion portion 322. The protrusion portion 322 is in a compressed shape, which is formed at the inner surface 332 of the base plate 33 corresponding to the pad 34. Concretely, the protrusion portion 322 is fixed on a side of the insulating layer 35, and a portion of the protrusion portion 322 is embedded in the insulating layer 35, which can fix and support the functional pins 32, and ovoid the functional pins 32 deflection or disengaging due to the vibration. Preferably, the whole protrusions portion 322 can be embedded in the insulating layers 35. Concretely, the second pin 323 is embedded in the insulating layer 35, and one end of the second pin 323 is electrically connected with the protrusion portion 322, the other end is electrically connected with the pad 34. In the present embodiment, the shape of the pad 34 is the same with that of the protrusion portion 322, and the two ends of the second pin 323 are fixedly connected with the centers of the pad 34 and the protrusion portion 322 respectively. The first pin 321, the protrusion portion 322 and the second pin 323 are molded in one piece. The pad 34 is formed by a portion of the functional pin 32 that drills through the base plate 33, that is, the pad 34 and the functional pin 32 are a structure molded in one piece. The pad 34 is formed by molding or punching the portion of the functional pin 32 that drills through the base plate 33. One portion of the pad 34 is embedded in the insulating layer 35 and matches with the protrusion portion 322 with a portion thereof also embedded in the insulating layer 35, thus not only the pad 34 is connected with the functional pin 32 firmly, but also the pad 34 is hard to disengage after soldered to the client product, thereby increasing the reliability and stability of the electric connection of the surface mounted oven controlled crystal oscillator 3. The area of the pad 34 is larger than the cross section area of the functional pin 32.

Preferably, the height difference between the pad 34 and the outer surface of the base plate 33 is less than 2 mm.

Figure 4A:
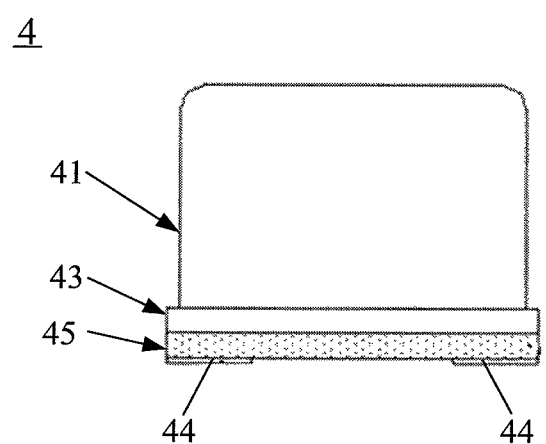
FIG. 4a is a front view of the surface mounted oven controlled crystal oscillator according to a second embodiment of the present invention.
Figure 4B:
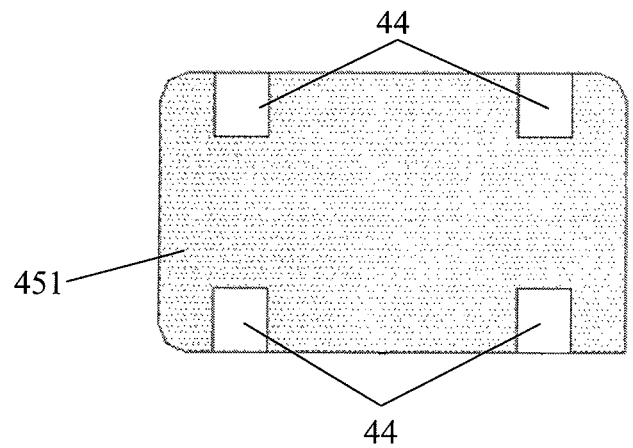
Figure 4C:
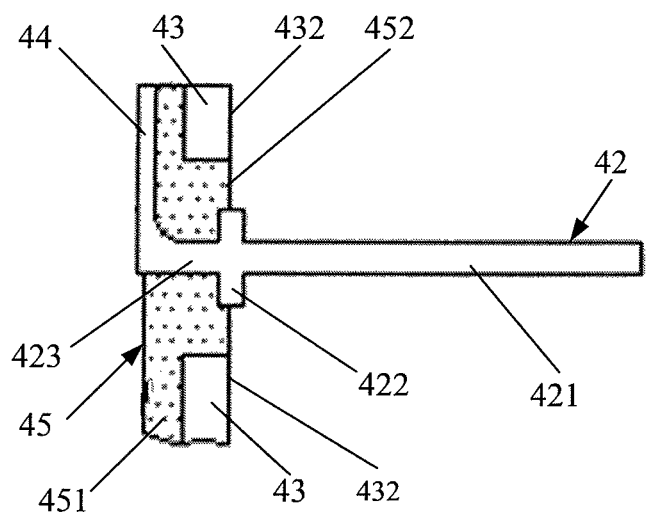

FIGS. 4a-4c show a surface mounted oven controlled crystal oscillator according to a second embodiment of the present invention. Referring to FIGS. 4a-4c, the surface mounted oven controlled crystal oscillator 4 includes a crystal oscillator shell 41, a crystal oscillation circuit (not shown), functional pins 42, a base plate 43, pads 44, and insulating layers 45. The differences compared to the first embodiment include the shape and configuration of the pads 44, and the shape and configuration of the insulating layers 45 of the surface mounted oven controlled crystal oscillator 4. Concretely, the four pads 44 are in a quadrangle shape, and one border of the quadrangle is aligned with a border of the base plate 43. The insulating layer 45 is divided into a first insulating layer 451 and a second insulating layer 452. The second insulating layer 452 is formed nearly the inner surface 432 of the base plate 43, and the first insulating layer 451 is fixedly connected with the second insulating layer 452. Similarly to function of the functional pin 32 in the first embodiment, the functional pin 32 includes a first pin 421, a protrusion portion 422 and a second pin 423. One end of the protrusion portion 422 is fixedly connected with the first pin 421, and the other end thereof is fixedly connected with one end of the second pin 423. The other end of the second pin 423 is connected with the pad 43 which is formed by punching the portion of the functional pin 42 drilling through the base plate 43. In the present embodiment, the second pin 423 and a portion of the protrusion portion 422 are embedded in the second insulating layer 452, and the whole protrusion portion 422 can be embedded in the second insulating layer 452 preferably. A portion of the pad 44 is embedded in the first insulating layer 451, and one end of the second pin 423 is fixedly connected with the center of the protrusion portion 422, the other end is fixedly connected with one border of the pad 44. The first insulating layer 451 covers other areas of the outer surface of the base plate 43, except for the four pads 44.

It should be noted that, the shape of the pad of the surface mounted oven controlled crystal oscillator of the present invention can be oval or other polygons depending on the actual demand, besides the circle and quadrangle mentioned in the above embodiments. Moreover, the amount of the pad is not limited to four; it can be increased or decreased depending on the actual demand. And the size of the pad is also depended on the actual demand of the client product. In addition, the size of the surface mounted oven controlled crystal oscillator of the present invention is also depended on the actual demand of the client product, which is familiar to one person ordinarily skilled in the art, and thus is omitted herefrom.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A surface mounted oven controlled crystal oscillator comprising a crystal oscillator shell, a crystal oscillation circuit, several functional pins, and a base plate, the crystal oscillation circuit being accommodated in a cavity that is formed by the crystal oscillator shell and the base plated and electrically connecting with the functional pins, the functional pins drilling through the base plate from the cavity, and an insulating layer being formed between each functional pin and the base plate, wherein the surface mounted oven controlled crystal oscillator further comprises several pads formed at an outer surface of the base pate, the insulating layer is also formed between each pad and the base plate, one portion of the pad is embedded in the insulating layer, and the functional pins are electrically connected with the corresponding pads respectively; wherein the functional pin comprises a first pin, a protrusion portion and a second pin, one end of the first pin is electrically connected with the crystal oscillation circuit, and the other end is electrically connected with the protrusion portion; a portion of the protrusion portion is formed at an inner surface of the base plate, a portion of the protrusion portion is embedded in the insulating layer; the second pin is embedded in the insulating layer, and one end of the second pin is electrically connected with the protrusion portion, the other end of the second pin is electrically connected with the pad.

2. The surface mounted oven controlled crystal oscillator according to claim 1, wherein the pad is formed by a portion of the functional pin that drills through the base plate.

3. The surface mounted oven controlled crystal oscillator according to claim 2, wherein the pad is formed by molding or punching the portion of the functional pin that drills through the base plate.

4. The surface mounted oven controlled crystal oscillator according to claim 1, wherein the area of the pad is larger than the cross section area of the functional pin.

5. The surface mounted oven controlled crystal oscillator according to claim 1, wherein the pad is circular, oval or polygonal.

6. The surface mounted oven controlled crystal oscillator according to claim 1, wherein a height difference between the pad and the outer surface of the base plate is less than 2 mm.

* * * * *